United States Patent [19]

Sakuma et al.

[11] Patent Number: 4,786,545

[45] Date of Patent: Nov. 22, 1988

[54] CIRCUIT SUBSTRATE AND METHOD FOR FORMING BUMPS ON THE CIRCUIT SUBSTRATE

[75] Inventors: Kunio Sakuma; Sadasumi Uchiyama, both of Nagano, Japan

[73] Assignee: Seiko Epson Corporation, Tokyo, Japan

[21] Appl. No.: 17,419

[22] Filed: Feb. 24, 1987

[30] Foreign Application Priority Data

Feb. 28, 1986 [JP] Japan ............................ 61-43226
Mar. 12, 1986 [JP] Japan ............................ 61-54424
Nov. 20, 1986 [JP] Japan ............................ 61-277488

[51] Int. Cl.$^4$ ............................ B32B 3/00; G03C 5/00
[52] U.S. Cl. ............................ 428/209; 428/220; 428/543; 428/901; 430/311; 430/313; 430/318; 430/319; 430/394; 156/659.1; 156/661.1; 156/901
[58] Field of Search ............ 430/311, 313, 318, 319, 430/394; 156/659.1, 661.1, 901, 902; 428/209, 220, 543, 901

[56] References Cited

U.S. PATENT DOCUMENTS

| | | | |
|---|---|---|---|
| 4,151,543 | 4/1979 | Hayakawa et al. | 357/65 |
| 4,259,436 | 3/1981 | Tabuchi et al. | |
| 4,564,582 | 1/1986 | Miyazaki | 430/311 |
| 4,587,185 | 5/1986 | Miyazaki | 430/5 |
| 4,587,199 | 5/1986 | Bennett | 430/260 |

FOREIGN PATENT DOCUMENTS

58-26828 8/1983 Japan .
59-17980 9/1984 Japan .
59-17981 9/1984 Japan .

*Primary Examiner*—John E. Kittle
*Assistant Examiner*—P. J. Ryan
*Attorney, Agent, or Firm*—Blum Kaplan

[57] ABSTRACT

A circuit substrate for use in manufacturing integrated circuit devices by the strip-support method in connection with a semiconductor element having conductive pads. The circuit substrate includes a base layer, a conductive circuit layer supported on the base layer for mechanically and electrically coupling to the conductive pads of a semiconductor device. The conductive circuit layer includes a plurality of finger leads with a bump at the end of each finger lead for mechanically and electrically coupling to one of the conductive pads. The coupling surface of each bump has a roughness in a range between 5 and 20 microns. The inherent roughness of the bumps can be augmented by plating the bumps with nickel and gold. A method for forming bumps on the conductive layer of a circuit substrate for attachment of the circuit substrate to conductive pads of a semiconductor element is also provided. The method includes coating a front and a back surface of the conductive layer with photo-resists. Then the photo-resists on both surfaces of the conductive layer are patterned by simultaneous exposure and development. Next, both surfaces of the conductive layer are half-etched. Then, one of the surfaces of the conductive layer is coated with a protective resist and the other surface of the conductive layer is etched. Finally, the photo-resist and protective resist are removed.

64 Claims, 6 Drawing Sheets

CIRCUIT SUBSTRATE AND METHOD FOR FORMING BUMPS ON THE CIRCUIT SUBSTRATE

BACKGROUND OF THE INVENTION

The invention is generally directed to a circuit substrate and the method for manufacturing the circuit substrate and in particular to a circuit substrate including bumps on the finger leads with specified surface roughness for connection with the conducting leads of a semiconductor element (hereinafter referred to as an "IC chip") which is designed to be mounted on the circuit substrate. The surface roughness of the bumps can be augmented by plating the surface of the bump. The circuit substrate is used to manufacture integrated circuit devices by the strip-support method which utilizes a roll of circuit substrate which acts as a carrier for many IC chips which are attached to the roll of substrate one after the other at high speed. The invention is also directed to the method of forming the bumps on the circuit substrate to aid in mechanically and electrically connecting the substrate to the electrodes of the IC chip or other electrical device.

Reference is made to FIG. 1 wherein a cross sectional view of a prior art circuit substrate including bumps for manufacturing integrated circuits in accordance with the strip-support method is depicted. The circuit substrate includes a circuit substrate base film 1 and a conductive pattern 3 coupled to base film 1 with an adhesive 2. Conductive pattern 3 has a finger lead portion 4 extending inwardly from base film 1 to make contact with an IC chip (not shown). Finger lead 4 has a narrowed or concave neck portion 5 and a bump portion 6. Contact surface 8 of bump 6 is adapted to be connected with the aluminum pads of an IC chip and is generally flat so that the roughness (distance between the highest point and the lowest point on the surface) is less than 3 microns. Japanese Patent Publication Nos. 58/26828 and 59/17980 generally disclose substrates with bumps formed at the end portions of the finger leads by plating or by half etching the middle portion of the finger lead. Although these references do not specifically refer to the characteristics of contact surface 8, the surfaces are generally smooth.

The prior art method of forming finger lead 4 exposes the front and back surfaces of the conductive layer to form conductive pattern 3 separately. As a result, the positioning of the substrate for exposure after several circuit substrates on the roll have been exposed is likely to be inaccurate which makes it difficult to form bump 6 accurately at a predetermined position on finger lead 4. The prior art method is shown in FIGS. 2A-2G described below in greater detail.

The prior art substrate structure suffers from several deficiencies. When the IC chips are attached by attempting to bond the aluminum pads on the IC chips to the substrate bumps, the connection between the IC chip and the substrate is often unstable, weak or absent, particularly when the oxide film on the surface of the aluminum pad is relatively thick. Generally, the aluminum pad of the IC chip and the bump of the finger lead are connected by thermal contact bonding, sometimes with a supersonic wave. However, the smooth surface of the bumps contacting the aluminum pad cannot destroy and remove the oxide film formed on the surface of the aluminum pads, thereby causing a weakened and unreliable contact between the substrate and the IC chip.

The prior art method of forming the bumps on the substrate disclosed in Japanese Patent application Ser. No. 59-17981 is shown in FIGS. 2A-2G. Like elements in the Figures are represented by like reference numerals. As shown in FIG. 2A, the front surface of conductive layer 20 is coated with a protective resist 71. Next, as shown in FIG. 2B, the back surface of conductive layer 20 is coated with a photo resist 30 and bump 6 is formed by exposure, development and half-etching in accordance with standard practice. Next, as shown in FIG. 2C, protective resist 71 and photo resist 30 on the front and back surfaces of conductive layer 20, respectively, are removed. Then, as shown in FIG. 2D, the front surface of conductive layer 20 is coated with a photo-resist 31 and patterned by exposure and development. Next, as shown in FIG. 2E, the back surface of conductive layer 20 is coated with a protective resist 72. As next shown in FIG. 2F, the front surface of conductive layer 20 is etched to form the circuit pattern including finger lead 4. Finally, as shown in FIG. 2G, photo-resist 31 and protective resist 72 are removed from the front and back surfaces of conductive layer 20, thereby forming bump 6 on the back surface of finger lead 4 around device opening 40.

However, this method has several defects. Since the front and back surfaces of conductive layer 20 are separately exposed, the positioning of the substrate for a series of exposures is likely to be inaccurate, which makes it difficult to form bump 6 accurately at a predetermined position on finger lead 4. Especially where the substrate is automatically exposed in a successive manner such as is the case in forming a substrate for use in the strip-support integrated circuit production method, the patterns on the front and back surfaces of the substrate can only be aligned in registration with each other initially. It is then impossible to assure proper alignment of the patterns at later positions along the strip. Thus, if the accuracy of positioning the substrate by the exposure apparatus is not exact or if the sprocket holes 50, which guide the movement of the substrate, change or are poorly placed, many defects, such as the bump being deformed and the bump being positioned incorrectly on the substrate can result. The positioning error between the bump on the substrate and the IC chip electrode also results in mechanical and electrical connection problems.

In addition, the prior art method half-etches conductive layer 20 which somewhat reduces its strength. Thereafter this weakened layer is then coated with photo-resist, exposed, developed and subjected to other processes which make it likely that the conductive layer will be negatively affected. As a result, cracks in the photo-resist can cause wiring discontinuities which makes such substrates useless. These problems in a production environment may not be discovered until the IC chip has been attached, increasing the cost of the error.

Accordingly, there is a need to provide an improved method for forming the bumps on the conductive layers of the circuit substrates where the positioning error of the bumps on the finger leads are prevented and the process is simplified to reduce damage to the conductive layers so that reliable formation of a desirable patterns is provided. There is also a need to provide an improved circuit substrate with bumps that have a surface roughness which destroys the oxide layer on the IC chip conductive pads to form a stronger and more reliable connection. There is also a need to plate the bumps to increase the surface roughness of the bumps.

SUMMARY OF THE INVENTION

The invention is generally directed to a circuit substrate for use in manufacturing integrated circuit devices by the strip-support method in connection with a semiconductor element having conductive pads. The circuit substrate includes a base conductive circuit supported on the base layer for electrically coupling to the conductive pads of the semiconductor device. The circuit layer includes a plurality of finger leads with a bump at the ends of each finger lead for mechanically and electrically coupling to one of the conductive pads. The connecting surface of each bump has a roughness in a range between 5 and 20 microns. The roughness of the connecting surface can be augmented by plating the connecting surface of the bump.

The invention is also generally directed to a method for forming bumps on the conductive layer of a circuit substrate for attachment of the circuit substrate to conductive pads of a semiconductor element. The method includes coating a front and a back surface of the conductor layer with photo-resists. Then patterning the photo-resists on both surfaces of the conductive layer by simultaneous exposure and development. Next, both surfaces of the conductive layer are half-etched. The surface of the conductive layer which will include the bump is coated with a protective resist. Then the other surface of the conductive layer is etched and finally the photo-resist and protective resist are removed.

Accordingly, it is an object of the invention to provide an improved circuit substrate structure.

Another object of the invention is to provide an improved circuit substrate structure which includes bumps at the end portions of finger leads, for attachment to the conductive pads of IC chips mounted on the substrate, where the bumps have a desired degree of roughness.

A further object of the invention is to provide a circuit substrate structure with bumps having a roughness of between 5 and 15 microns to improve connection of the circuit substrate structure to the conductive pad of the IC chip.

Yet another object of the invention is to provide a circuit substrate having bumps of a specified roughness to eliminate the oxide film on the surface of the aluminum pad of the IC chip.

A further object of the invention is to provide a circuit substrate with bumps on the finger leads wherein the roughness of the bumps is increased by plating.

Still another object of the invention is to provide an improved method for forming bumps in the conductive layer on a circuit substrate for connection with an external electronic element.

Still other objects and advantages of the invention will in part be obvious and will in part be apparent from the specification.

The invention accordingly comprises the several steps and the relation of one or more of such steps with respect to each of the others, and the article possessing the features, properties, and the relation of elements, which are exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Figure 3:
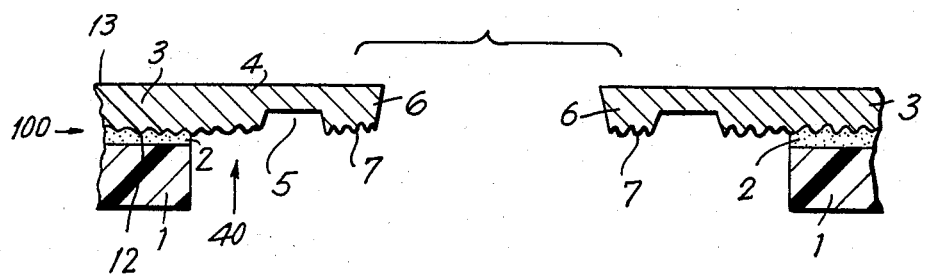
FIG. 3 is a partially cut away cross sectional view of a circuit substrate strip constructed in accordance with a preferred embodiment of the invention.

Reference is made to FIG. 3 wherein a cut away cross sectional view of a circuit substrate 100, constructed in accordance with the invention is depicted. Circuit substrate 100 includes a substrate base film of polyimide or the like and a conductive pattern 3 which is connected to circuit substrate base film 1 with an adhesive layer 2. The conductive pattern is set up to provide connections from the pads or an IC chip to the edges of the substrate. The conductive pattern 3 includes a finger lead 4 which extends to opening 40 in circuit substrate base film 1. Finger lead 4 includes a neck or concave portion 5 and a bump portion 6. Bump portion 6 has a connection surface 7 for forming a connection with the conductive pads on an integrated circuit chip or other semiconductor elements. Bump portion 6 is generally formed of copper material with a nickel plating on the copper and a gold plating as the outer-most surface of contact surface 7. In a preferred embodiment contact surface 7 has a roughness of about 9 micron with additional roughness due to the plating described below which is within a preferred range of roughness. For comparison, the prior art circuit substrate shown in FIG. 1 has a connection surface 8 on bump 6 of 3 microns or less.

Figure 1:
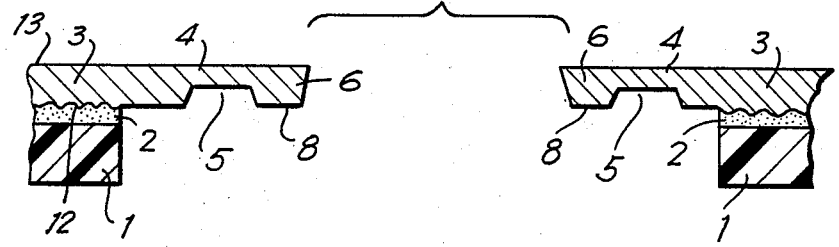
FIG. 1 is a partially cut away cross sectional view of a circuit substrate constructed in accordance with the prior art.

Circuit substrate 100 shown in FIG. 1 has a finger lead 4 that is about 35 microns thick and about 60 microns wide. The depth of thinned neck portion 5 is about 15 microns. Bump 6 is about 35 microns thick and has a width and length of about 60 microns. In this way, bump 6 forms a substantially square contact surface 7 for forming a connection with a conducting pad on the IC chip. In a preferred embodiment contact surface 7 of bump 6 is formed of copper material with a nickel plating having a thickness up to about 1 micron and a gold plating thereon having an average thickness up to about 1 micron. The overall roughness of surface 7 is about 9 microns.

Figure 5:
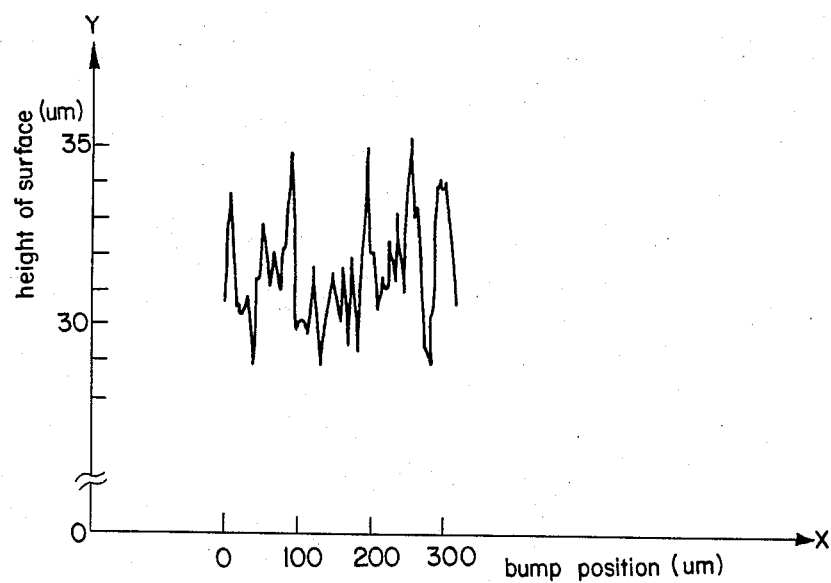
FIG. 5 is a graphical representation of the roughness of the connection surface of a bump constructed in accordance with a preferred embodiment of the invention.

The roughness of a surface as used herein is defined as the difference between the highest and lowest points on the surface. FIG. 5 depicts measured data of the surface roughness. The bump connection surface 7 can be on the same side of conducting pattern 3 as shown in FIG. 3 or on the opposite side 13. When bump connection surface 7 is on the side of conductive pattern 3 facing circuit substrate 1, as shown in FIG. 3, the uneven contact surface 12 in contact with adhesive layer 2 is coupled without chemical polishing or other means of smoothing contact surface 12. Then, contact surface 12 is plated first with nickel and then with gold. Contact surface 12 is roughened primarily with particles separated out from the electrolytic copper plating in forming the copper foil to improve the strength of the adhesion between circuit substrate 1 and conductive pattern 3.

On the other hand, when contact surface 7 is provided on the side of conductive pattern 3 opposite from circuit substrate base film 1, non-contacting surface 13 of finger lead 4 has a roughness of 3 microns or less resulting from the formation of the copper foil. Accordingly, chemical etching is performed on surface 13 to make it roughened. Thereafter, surface 13 is plated first with nickel and then with gold.

Figure 4:
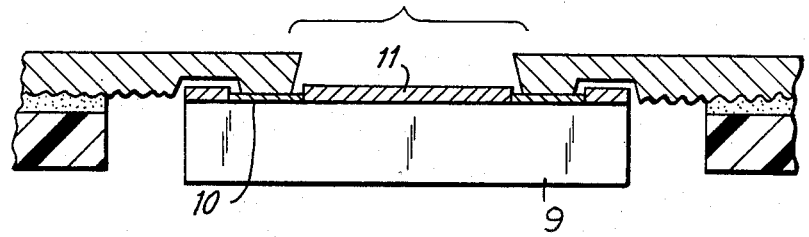
FIG. 4 is a partially cut away cross sectional view of a circuit substrate with an IC chip mounted thereon in accordance with the present invention.
Figure 2A:
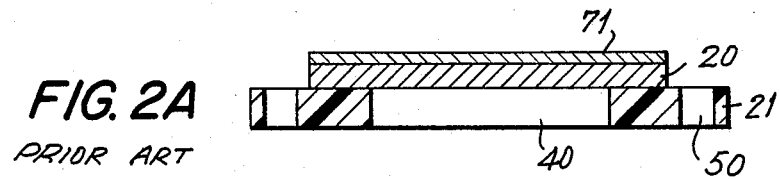
FIGS. 2A–2G are cross sectional views showing a prior art method for forming an electrical connection bump on the circuit substrate strip.
Figure 2B:
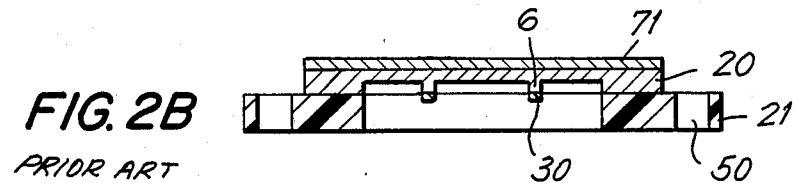
Figure 2C:
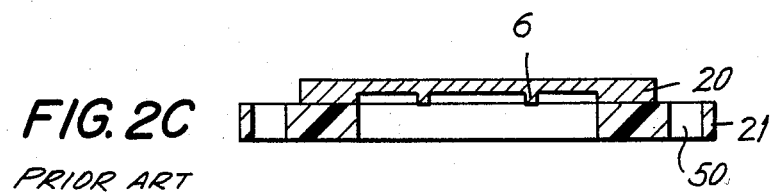
Figure 2D:
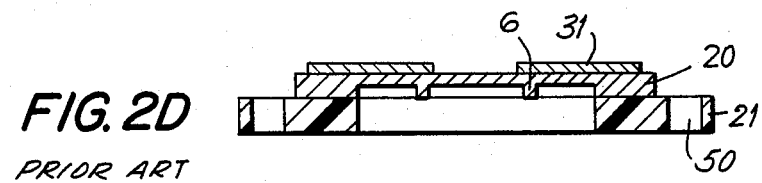
Figure 2E:
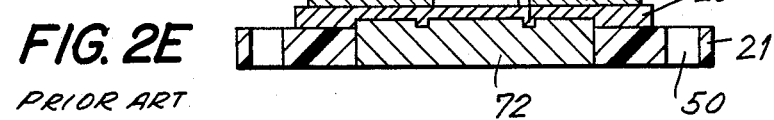
Figure 2F:
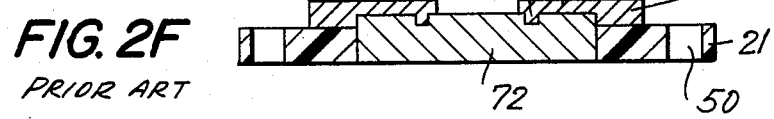
Figure 2G:
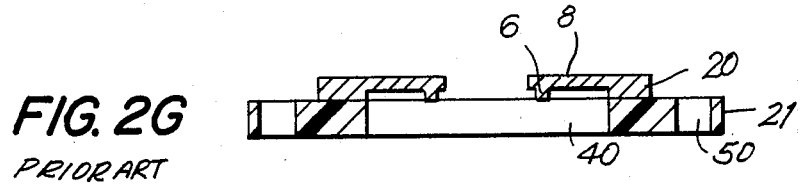

A strong and stable connection, as shown FIG. 4, is provided when the aluminum pad of IC chip 9 and bump 6 of circuit substrate structure 100 are coupled in accordance with the invention. The strong and stable connection is obtained by first positioning aluminum pad 10 of IC chip 9 in registration with bump 6 of finger lead 4. As noted above, IC chip 9 may have a conductive pad formed of a conductor other than aluminum. Bump 6 of finger lead 4 is then pressed onto IC chip 9 so that the connection surface 7 of bump 6 is in contact with aluminum pad IO using a heating tool. Next, pressure and heat are applied to the connection. In a preferred approach the pressure is about 100 g per bump and a heat of about 500° C. is applied by the heating tool for about 1-2 seconds. As this occurs, the projecting portions on contact surface 7 first bore into aluminum pad 10 of IC chip 9 like wedges. Then, as a result of the pressure applied by the heating tool, these projecting portions of connecting surface 7 of bump 6 are crushed and forced to spread outward perpendicular to the direction of the pressure. This results in the aluminum oxide film on the surface of aluminum pad 10, which is pierced by the projecting portions, being effectively destroyed and removed to expose the pure aluminum surface of pad 10. Under the pressure and heat conditions utilized to make the connection, the metal forming substrate bump 6 and aluminum pad 10 react easily to form an efficient alloy thereby providing a strong connection.

When an IC chip 9 is coupled to the circuit substrate structure 100 in accordance with the invention in the manner described above, the mean connection strength between the substrate bump and the aluminum pad has been determined to be 22.1 g with a standard deviation of 4.1 g, which is about a 50% improvement over the prior art connection which has a mean strength of 14.6 g with a standard deviation of 5.4 g. In addition, the connection yield, the percentage of successful connections between finger lead 4 and pads 10, is also improved to 99% or more utilizing the circuit substrate in accordance with the invention as compared to a connection yield of about 80% with the prior art structure. The connection strength is defined as the resistance against destruction measured with a measuring device by a method in which a terminal of the measurement device is hitched around neck-like portion 5 of finger lead 4 in FIG. 4 and the device goes in the direction opposite from IC chip 9 (i.e. upward in FIG. 4). Another device exerts sufficient pressure until destruction occurs. Depending upon the strength of the connection, the connection between finger lead 4 and IC chip 9 may be destroyed, finger lead 9 itself may be destroyed or IC chip 9 may be destroyed.

TABLE 1 shows detailed data concerning the connection strength and the connection yield resulting with variations in the roughness of contact surface 7 of bump 6.

TABLE 1

| roughness | connection strength | connection yield |
| --- | --- | --- |
| 3 micron | 14.6 g | 80% |
| 5 micron | 19.8 g | 95% |
| 7 micron | 21.3 g | 97% |
| 9 micron | 22.1 g | 99% |
| 12 micron | 22.3 g | 99% |
| 15 micron | 22.0 g | 99% |
| 19 micron | 17.1 g | 98% |

As apparent from the data in TABLE 1, when the roughness of connection surface 7 is between about 5 and 15 microns, the connection strength and connection yields are very high. When the roughness is equal to 3 microns (the maximum found in the prior art circuit substrate structure), that is below 5 microns, the destruction of the oxide film on the pad of the IC chip is limited so that connection strength and connection yield are inadequate for practical use. When the roughness is 19 microns, that is, over 15 microns, the connection yield is still high but an additional problem is presented. Because the roughness of contact surface 7 is so large, the thickness of finger lead 4 in bump 6 at the thinnest portions is significantly reduced. This results in the strength of the finger lead itself being even smaller then the strength of the joint portion. However, even at this roughness a significant improvement over the prior art approach is found.

Accordingly, a range of roughness is between about 5 and 20 microns is desired and a roughness of the contact surface 7 of substrate bump 6 between 5 and 15 microns is most preferred.

As described above, it is particularly desirable for contact surface 7 to have a heightened degree of roughness to improve the connection between the circuit substrate and IC chip. As shown in FIG. 3, circuit substrate base film 1, formed of polyimide and glass-reinforced epoxy is coupled to conductive pattern 3 with an adhesive 2. Conductive pattern 3 has a finger lead portion 4 having a bump portion 6 thereon. Contact surface 7 of bump 6 is plated with first nickel and then gold to increase the roughness of contact surface 7.

As described above, the coupling of aluminum pad 10 of IC chip 9 (FIG. 4) and bump 6 is aided by the roughened surface of contact surface 7 which pierces the surface of aluminum pad 10 on IC chip 9. This destroys the oxide film on the surface of the aluminum pad, the projecting portions of contact surface 7 spread out and a strong connection is made between the clean medal surface of the aluminum pad underneath the oxide film and the metal on bump 6 which form a strong and durable alloy.

The roughness of the surface of bump 6 has a large effect on the strength of the connection between substrate 100 and IC chip 9. A direct relationship between the roughness and the connection exists with a greater surface roughness corresponding to a stronger connection. As described above, the maximum preferred surface roughness is between about 5 and 20 microns. The roughness of the surface of the bump may be formed as a result of sprinkling or the presence of fine grooves.

In a preferred embodiment, the conductive material forming conductive pattern 3 on substrate base film 1 is electrolytic copper foil. The back surface of the copper foil (i.e. the surface facing substrate base film 1), which becomes contact surface 7 of bump 6 is formed to have a maximum roughness of between 5 and 12 microns during the depositing of electrolytic copper plating in manufacturing the copper foil. This improves the adhesion strength between the back surface of the copper foil and substrate base film 1, increasing the effectiveness of adhesive 2. This inherent roughness of between 5 and 12 microns is reduced to between 3 and 8 microns as a result of the various processes, such as surface treatment, etching and others used in manufacturing circuit substrate 100 with bumps 6.

Figure 6:
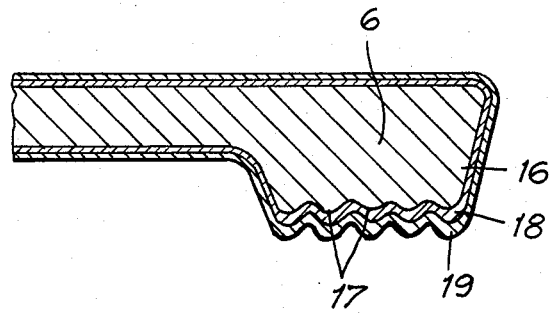
FIG. 6 is an enlarged partially cut away cross sectional view of a bump constructed in accordance with a preferred embodiment of the invention.

By utilizing the phenomenon that electric current is concentrated at pointed portions, the surface of bump 6 is electrically plated with nickel and then with gold, thereby enlarging the fine projected portions on surface 7. Reference is made to FIG. 6 wherein an enlarged cross sectional view of bump 6 is shown. Bump region 6 is formed of copper foil 16, nickel layer 18 and gold layer 19. Plating layers 18 and 19 are thickest at the areas at which the electric current is concentrated, i.e. the outwardly extending projections 17 on surface 7 and thinner in the areas surrounding projecting portions 17. As a result, the overall roughness of surface 7 is increased.

The favorable effects of this phenomenon are increased as the electric current density during the plating operation is increased. As a result, it is desirable to make the electric current density as high as possible without producing plating stain. After the circuit substrate is constructed in accordance with the invention, nickel layer 18 is plated with a thickness of between 0.5 and 1 micron. Then, gold layer 19 is plated on the nickel with an electric current density of about 2.5 A/dm for about one minute. The mean total thickness of the plating resultant is about 1.5 microns and the maximum roughness of the surface is increased by between 2 and 6 microns. The positive benefits of the plating operation are not limited to the embodiment described above and variations in the effect occur depending upon the plating apparatus and plating solutions used. When plating layers of the same thickness as described above are desired, plating with an electric current density near the upper limit of electric current densities which can be practically tolerated, results in a large surface roughness after only a short time.

TABLE 2 shows data obtained relating the total surface roughness of the bump prior to and after plating when gold having a mean thickness of about 1.5 microns is plated under various electric current density conditions on copper foils having four different levels of surface roughness.

TABLE 2

| Electric Current Density | Copper Foil Surface Roughness | Total Surface Roughness | Connection Strength | Connection Yield |
|---|---|---|---|---|
| 0.5 A/dm² | 3 micron | 3 micron | 12.5 g | 80% |
| 1.5 | 3 | 5 | 19.8 | 95 |
| 2.5 | 3 | 6 | 21.5 | 96 |
| 0.5 | 7 | 7 | 21.2 | 96 |
| 1.5 | 7 | 9 | 23.6 | 99 |
| 2.5 | 7 | 10 | 24.3 | 99 |
| 0.5 | 11 | 12 | 21.4 | 98 |
| 1.5 | 11 | 14 | 22.4 | 98 |
| 2.5 | 11 | 15 | 23.0 | 99 |
| 0.5 | 15 | 16 | 19.2 | 95 |
| 1.5 | 15 | 18 | 19.5 | 96 |
| 2.5. | 15 | 20 | 18.5 | 96 |

The data in TABLE 2 was based on square bumps sides of 60 microns. The nickel plating had a thickness of about 1 micron and the connection strength was measured as the point at which the connection or the finger lead itself was destroyed by pulling vertically upward on the middle portion of the finger lead.

As seen in the data in TABLE 2, the greater the electric current density, the larger the additional roughness added to the copper foils inherent roughness and the greater the stability and strength of the connection. Especially when the total surface roughness is 5 microns or more, a stable, reliable and strong connection is formed. When the surface roughness of the copper foil or other base material is small, the plating technique is particularly effective to increase the overall surface roughness. On the other hand, when the surface roughness of the copper foil is 15 microns, the copper foil surface is so rough that the strength of the finger lead itself decreases.

The upper limit of appropriate total surface roughness taking the optimum thickness of the gold plating into account is about 20 microns. Thus, a total surface roughness between about 5 and 20 microns is desirable. As discussed above, the range between 5 and 15 microns is even more preferrable due to the weakening of the finger lead as the overall surface roughness increases above 15 microns.

The above described embodiment has the bump formed on the back surface of the electrolytically formed copper foil which has inherently large surface roughness. However, when the bump is formed on the front surface of the copper foil, which has an inherent roughness of less than 3 microns, or where rolled copper foil is used, the surface can be roughened either mechanically using brush-polishing or sand blasting or by a chemical method using an aqueous solution of ammonium persulfate or sodium persulfate. The roughness is then increased by using the plating in the same way as described above. Treating the bump in this manner a stable and strong connection between the substrate bump and aluminum pad of the IC chip is formed which is equivalent to the connection formed where the bump is on the back surface of the electrolytic copper foil.

Figure 7:
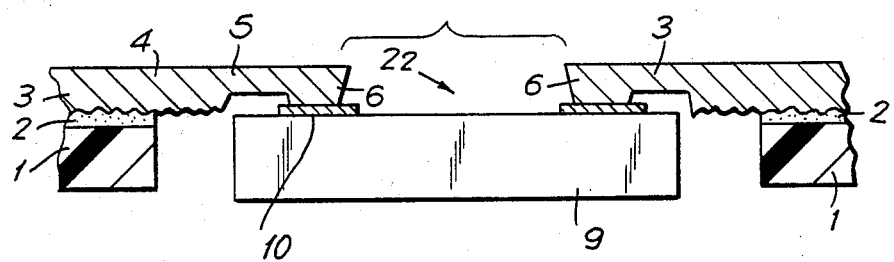
FIG. 7 is a partially cut away cross sectional view of a semiconductor device including a circuit substrate with a bump constructed in accordance with the invention having an IC chip mounted thereon.

FIG. 7 is a cross sectional view of a semiconductor device 22 which is formed by bonding an IC chip 9 onto circuit substrate 100. FIG. 7 shows bump 6 and aluminum pad 10 positioned in registration with each other and thermally contact-bonded as described above with the roughness of bump 6 being converted into a strong and stable bond with aluminum pad 10. FIG. 7 shows semiconductor device 22 formed with IC chip 9 coupled to bumps 6 on the back surface of conducting pattern 3. As discussed above, the present invention is equally appropriate whether the bumps 6 are formed on the back or front surfaces of conducting pattern 3.

To produce an effective circuit substrate with bumps having the desired degree of roughness and reliable sturdiness, an improved method of manufacturing the circuit substrate is required. Reference is made to FIGS. 8A–8F wherein a method for producing a circuit substrate 100 (shown in FIG. 8F) in accordance with the invention is depicted. FIGS. 8A–8F show a method of constructing an electrical contact bump on the finger leads of a strip-support circuit substrate.

Figure 8A:
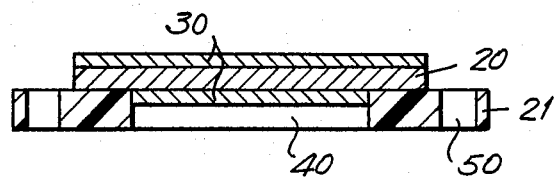
FIGS. 8A–8F are a series of cross sectional views illustrating a method for forming a bump on a substrate conductive portion in accordance with a preferred embodiment of the invention.

As shown in FIG. 8A, both surfaces of conductive layer 20 (which will be formed into conductive layer 3), which is attached to insulating circuit substrate base layer 1 are coated with a photo-resist 30. The opening 40 in the center of substrate 1 provides an opening in which the IC chip can be received. Insulating layer 1 is a flexible tape constructed of a polyimide and/or glass-reinforced epoxy having a thickness between 25 and 125 microns and provided with a series of device holes 40 in the center for holding the electronic member elements, such as a semiconductor chip. Layer 1 has sprocket holes 50 on both sides for positioning and moving insulating layer 1. Insulating layer 1 may also be provided with additional holes which may be necessary for the circuits.

Conductive layer 20 is generally a copper foil having a thickness of between 35 and 70 microns with the back surface treated to have a roughness (distance between the highest point and lowest point of the surface) of about 10 microns in order to improve the adhesion between conductive layer 20 and insulating layer 1. The roughness in conductive layer 20 is retained on the surface of the bump, which is formulated in the process. As described above, this roughened surface is significant in the connection of the aluminum pads on the IC chip to the substrate. The projecting portions of the rough surface pierce the oxide film on the aluminum pads to enhance the strength of the connection. As a result, it is important to maintain the initial surface roughness during the formation of the bumps. In order to do this, the photo resist 30 on the back surface of conductive layer 20 must be thick enough so that the convex portions of the surface are not etched during the later half-etching process. Also, they must not be too thick so as to become non-uniform. The thickness of photo resist 30 on the back surface of conductive layer 20 is preferably between about 1.5 and 4 microns. The thickness of the photo resist 30 on the front surface of conductive layer 20 is preferably between about 1 and 3 microns. The photo resist 30 on both surfaces of conductive layer 20 are coated by a roll coater, spraying and other steps in accordance with conventional coating techniques.

Figure 8B:
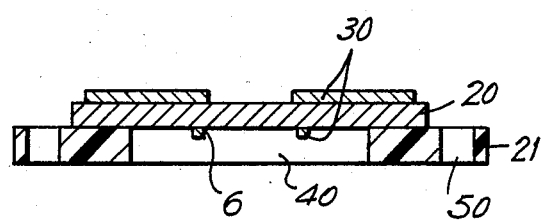
Figure 9:
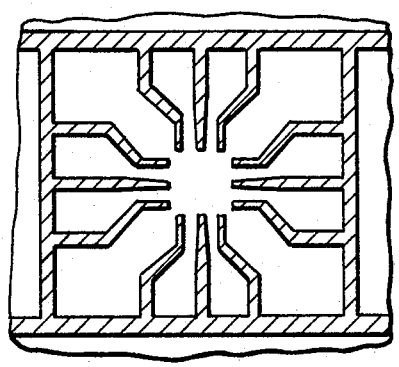
FIGS. 9–11 are plan views of photo-masks used in the method of FIGS. 8A–8F in accordance with the invention.
Figure 10:
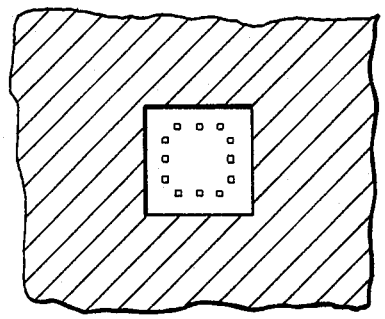

Reference is next made to FIG. 8B wherein both surfaces of conductive layer 20 are simultaneously exposed to form the circuit patterns. The finger lead on the front surface is exposed using a photo-mask as shown in FIG. 9 and the back surface is exposed using the photo-mask shown in FIG. 10 to form the bump pattern on the back surface. This simultaneous exposure of both surfaces of conductive layer 20 is achieved by using a 2-sided exposure apparatus which has been adjusted to form the patterns at predetermined positions on both surfaces. Then, both surfaces are simultaneously developed by spraying or dipping in an appropriate development solution.

Figure 11:
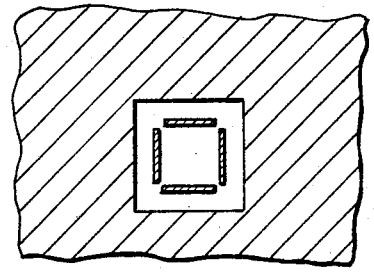

The photo-mask shown in FIG. 9 is designed to be thoroughly conductive so that the entire circuit pattern including the inner leads are electrically plated in a later step. Instead of the photo-mask shown in FIG. 10, the photo-mask shown in FIG. 11 which shows parts or all of the bumps connect instead of the separate projections type mask shown in FIG. 10 may also be used. In that case the bumps are separated later.

Adjustments are made to assure that both surfaces of conductive layer 20 are optimized for development at the same time. The amount of exposure to which each side is exposed is adjusted in a manner so that when the thicknesses of the photo resists on both sides are equal, the amount of light for exposing the back surface of conductive layer 20, which has a large degree of roughness and is difficult to develop, is 1.5 to 2.5 times as large as the amount of light to which the front surface, which is less rough, is exposed.

Figure 8C:
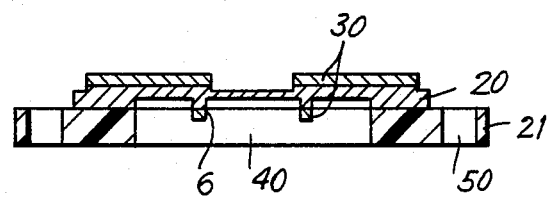

Reference is next made to FIG. 8C wherein both surfaces of conductive layer 20 are half-etched by spraying an etching solution such as ferric chloride on them. The height of bump 6 on the back surface of conductive layer 20 depends on the thickness of the conductive layer used. Generally, when conductive layer 20 is a copper foil having a thickness of about 35 microns, the height of bump 6 is desirably between 5 and 20 microns in order to prevent the semiconductor chip edge from short circuiting and to also assure the strength of the finger lead.

Figure 12:
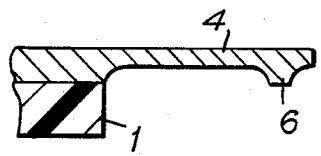
FIG. 12 is a partial sectional view of a finger lead produced in accordance with the invention.

In order to prevent conductive layer 20 from disconnecting at the corners of the half-etched portions, at which the stress is concentrated, the spray pressure is reduced and the etching at the sides is designed to form a large rounded curve at the corners of the half-etched portions as shown in FIG. 12.

Usually, the half-etching is carried out by spraying a solution of ferric chloride at a solution temperature between 25° and 40° C. with a specific gravity between 30 and 60 Be (Baume) at a spraying pressure of 0.5 kgf/cm$^2$ or less. However, if the height of bump 6 is less than half the thickness of conductive layer 20, the half-etching can be conducted by the dipping method as well.

Figure 13:
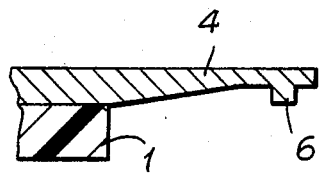
FIG. 13 is a partial cross sectional view of a finger lead in accordance with another embodiment of the invention.
Figure 14:
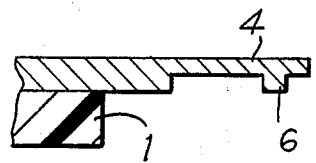
FIG. 14 is a partial cross sectional view of a finger lead constructed in accordance with a further embodiment of the invention.

In order to assure sufficient strength of the finger leads, the photo-mask used in forming the bump pattern on the back surface of conductive layer 20 is often modified to progressively vary the amount of half-etching to produce a pattern as shown in FIG. 13 or to make the half-etched portion as short as possible as is shown in FIG. 14.

Figure 8D:
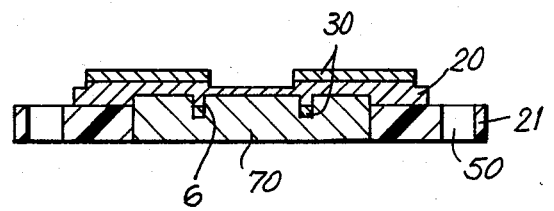

Reference is next made to FIG. 8D wherein the back surface of conductive layer 20 is coated with a protective resist 70 such as an etching resist or photo resist which can be removed by the same solution which removes the photo-resist formed in the step shown in FIG. 8A by the roll coater or spraying.

Figure 8E:
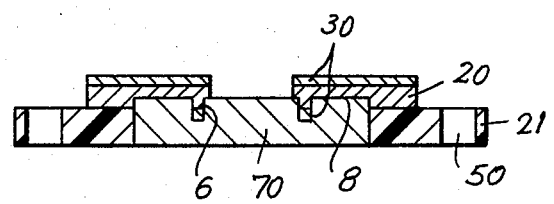

Next, as shown in FIG. 8E, the etching solution is sprayed on the front surface of conductive layer 20 to etch the unnecessary conductive layer which remained without being etched by the half-etching shown in FIG. 8C. Thus, the circuit pattern including finger leads 4 is now completely formed.

Figure 8F:
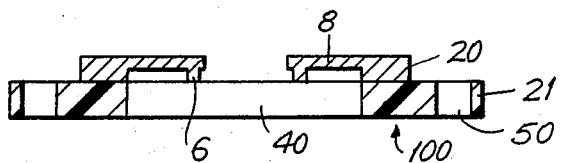

Finally, as shown in FIG. 8F, the photo resist 30 and the protective resist 70 are removed with the specified removing solution. This finally produces the finished strip-support circuit substrate including a finger lead 4 with bump 6 for forming the electrical connections. Each substrate has as many finger leads with bumps as there are pads on the corresponding IC chip. The process has been shown with only a single bump for ease of explanation.

After circuit substrate 100 is completed, the projections are plated with nickel having a thickness between about 0 and 3 microns and then plated with gold having a thickness between about 0.5 and 4 microns. Then, the bump 6 is positioned in registration with the aluminum pad 10 of IC chip 9 and thermally bonded to make the electrical connections therebetween.

Figure 15:
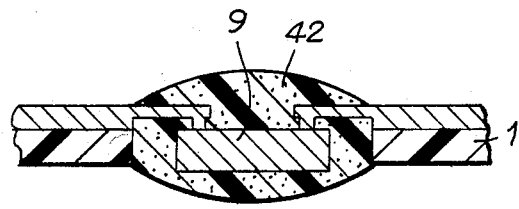
FIG. 15 is a cross sectional view of a semiconductor chip mounted on the strip-support substrate in accordance with the invention.

FIG. 15 shows the structure in which IC chip 9 is mounted on strip-support circuit substrate 1 in accordance with the invention. The connection is then sealed with a resin sealing agent 42 which protects the chip and connection from damage.

The method of forming a circuit substrate with finger leads having a bump has been described in connection with a strip-support circuit substrate by way of example. However, the method is not limited to strip-support circuit substrates but is also applicable to all types of printed substrates including a finger lead for connecting with an electrical member element.

The circuit substrate structure constructed as described allows for the mounting of an IC chip to the substrate with the convex portions of the roughened surface of the bumps eating into the surface of the aluminum pad, expanding sideward and thereby effectively destroying the oxide film on the surface of the aluminum or the conductive pad on the IC. Then, the metal forming the substrate bump and the pure metal inside of the aluminum pad are easily formed into a strong alloy which provides a strong and stable connection of the substrate and IC chip. As the roughness of the contact surface of the bump on the substrate increases to at least 5 microns, the oxide film on the aluminum pad is effectively destroyed producing increased connections strength and excellent connection yields. However, as the inherent roughness of the conductive material increases above 15 microns, however, the thickness of the bump at its thinest portion is significantly reduced and the strength of the finger lead itself becomes weaker than the connection strength between the substrate and IC chip. However, a roughness extending up to about 20 microns can be utilized with a combination of the inherent roughness of the conductive portion and the additional roughness due to the plating material.

The bump is formed in a substrate consisting of an insulating layer formed of a resin having an opening for holding an IC chip and a conductive layer of metal foil such as copper which covers the opening for making electrical connections between the IC chip and the substrate. The bumps are formed on the finger leads of the conductive layer in accordance with a method that first coats both surfaces of the conductive layer with photo-resists. Next, both surfaces of the conductive layer are patterned by simultaneous exposure and development to assure alignment of the patterns on both sides of the conductive layer so that the bumps are at the appropriate locations on the finger leads. Next, both surfaces of the conductive layer are half-etched, the back surface of the conductive layer is coated with a protective resist, then the front surface of the conductive layer is etched and finally the photo-resist and protective resist are removed.

In this way, in accordance with the method, the finger lead and bump patterns are simultaneously formed on the front and back surfaces of the conductive layer with a 2-sided exposure apparatus. Thus, if the patterns on both surfaces are initially in registration with each other, there is no relative positioning error between the patterns on both surfaces as subsequent patterns are formed on the substrate. This is particularly critical with the strip-support method which uses a very long roll of continuous substrate for forming many integrated circuits. Thus, the accuracy of positioning the substrate relative to the exposure apparatus and the accuracy of positioning the sprocket holes on the substrate are not critical. The bumps are always accurately formed at the appropriate position on the finger lead. Thus, better positioning and more stable connections between the substrate and IC chip are achieved.

As a result of the method in accordance with the invention the number of steps is reduced over the prior art method. Particularly, after the half-etching of the conductive layer, the back surface of the conductive layer is only coated once by the protective resist before the final etching so that the conductive layer is less likely to be negatively effected which prevents cracking occurring on the photo-resist and assure strong and stable circuit patterns to be formed. Further, the simplification of the production method also leads to large reductions in the manufacturing costs associated with producing the substrate.

After the bumps are formed on the circuit substrate the roughness of the bumps can be increased by plating so that the overall roughness of the surface of the bump is in a range between 5 and 20 microns. As a result of this the roughened surface easily destroys the oxide film on the surface of the aluminum pad of the IC chip thereby significantly improving the strength and stability of the connection between the substrate bump and aluminum or other pad of the IC chip.

Accordingly, a circuit substrate for manufacturing integrated circuit devices by the strip-support method where the substrate includes bumps at the end portions of the finger leads in registration with the aluminum pads of the integrated circuit chips being mounted on the substrate and the surface of the bumps has a roughness within specified parameters is provided. The surface of the bumps has a preferred roughness between 5 and 15 microns. The roughness of the bump surfaces is increased in a preferred embodiment by plating nickel and then gold on the surface of the bumps. With the plating the preferred range of surface roughness is extended to between 5 and 20 microns. The improved method for forming bumps on the substrate conductive portion improves the alignment of the conductive pattern and bumps formed on opposite sides of the conductive layer to improve the strength and stability of the connection and reduce the manufacturing cost by simplifying the process.

The semiconductor elements have been designated as IC chips for uniformity of notation. However, any variety of semiconductor elements may be used which may not be properly classified as IC chips. In addition, the conductive pads on the IC chips have been identified as aluminum. However, the invention is equally applicable to conductive pads of other material which form oxide layers that tend to weaken the connection between the IC chip and semiconductor substrate.

It will thus be seen that the objects set forth above, among those made apparent from the preceding description, are efficiently attained and, since certain changes may be made in carrying out the above method and in the article set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A circuit substrate for use in manufacturing integrated circuit devices by the strip-support method in connection with a semiconductor element having conductive pads, the circuit substrate comprising: base means formed of insulating material; circuit means supported on the base means for mechanically and electrically coupling to the conductive pads of a semiconductor device, the circuit means including a plurality of finger leads with a bump at the end of each finger lead for mechanically and electrically coupling to one of the conductive pads, the coupling surface of each bump having a roughness in a range between 5 and 20 microns, with the increase in roughness to bond the bumps and conductive pads firmly by breaking any oxide film formed on the conductive pads of the IC chip.

2. The circuit substrate of claim 1 wherein the roughness of the coupling surface is in a range between 5 and 15 microns.

3. The circuit substrate of claim 1 wherein the circuit means includes plating on the coupling surface of the bump for increasing the roughness of the coupling surface.

4. The circuit substrate of claim 3 wherein the plating includes a layer of nickel and a layer of gold.

5. The circuit substrate of claim 4 wherein the layer of nickel plating is between about 0.5 and 3 microns in thickness.

6. The circuit substrate of claim 4 wherein the mean total thickness of the gold plating is between about 0.5 and 4 microns.

7. The circuit substrate of claim 6 wherein the gold plating increases the roughness of the coupling surface of the bump by an additional 2-6 microns.

8. The circuit substrate of claim 4 wherein the gold is plated with an electric current density of 2.5 A/dm for about one minute.

9. The circuit substrate of claim 2 further comprising plating on the contact surface of the bumps.

10. The circuit substrate of claim 9 wherein the plating includes a layer of nickel and a layer of gold.

11. The circuit substrate of claim 10 wherein the layer of nickel plating is between about 0.5 and 3 microns in thickness.

12. The circuit substrate of claim 10 wherein the mean total thickness of the gold plating is between about 0.5 and 4 microns.

13. The circuit substrate of claim 12 wherein the gold plating increases the roughness of the coupling surface of the bump by an additional 2-6 microns.

14. The circuit substrate of claim 13 wherein the roughness of the plated connecting surface is in a range between 5 and 20 microns.

15. The circuit substrate of claim 1 wherein the base means is an insulating layer.

16. The circuit substrate of claim 1 wherein the base means is a substrate formed of polyimide.

17. The circuit substrate of claim 1 wherein the base means is a substrate formed of glass-reinforced epoxy.

18. The circuit substrate of claim 1 wherein the base means is formed as a thin tape adapted to be coupled to a multiplicity of semiconductor elements.

19. The circuit substrate of claim 18 wherein the substrate includes device openings, each of which is adapted to receive a semiconductor element therein.

20. The circuit substrate of claim 18 wherein the substrate includes sprocket holes for controlling movement and alignment of the substrate.

21. The circuit substrate of claim 1 wherein the circuit means is formed of copper foil.

22. The circuit substrate of claim 19 wherein the finger leads extend over the device opening.

23. The circuit substrate of claim 1 wherein the circuit means is coupled to the base means with an adhesive.

24. The circuit substrate of claim 1 wherein the bumps are about 35 microns thick, 60 microns wide and about 60 microns long.

25. The circuit substrate of claim 1 wherein the bumps are formed on the side of the base means supported on the circuit means.

26. The circuit substrate of claim 1 wherein the bumps are formed on the surface of the circuit means opposite to the surface supported on the base means.

27. The circuit substrate of claim 1 wherein the mean connection strength between a bump and a conductive pad of a semiconductor element is about 22.1 g with a standard deviation of about 4.1 g.

28. The circuit substrate of claim 1 wherein the connection yield of bumps coupled to conductive pad on semiconductor devices is at least 99%.

29. A circuit substrate for use in manufacturing integrated circuit devices by the strip-support method in connection with semiconductor elements having conductive pads, said circuit substrate comprising: base means formed of insulating material; circuit means supported on the base means for mechanically and electrically coupling to the conductive pads on a semiconductor element, including a plurality of finger leads with bumps proximate the ends of each finger lead for mechanically and electrically coupling to one of the conductive pads, and plating means for increasing the roughness of the connection surface of the bumps to bond the bumps and conductive pads firmly by breaking any oxide film formed on the conductive pads of the IC chip; whereby a stronger more reliable connection between the circuit means and semiconductor element conductive pad is achieved.

30. The circuit substrate of claim 29 wherein the roughness of the plated bump surface is in a range between 5 and 20 microns.

31. The circuit substrate of claim 29 wherein the coupling surface of the bumps are roughened.

32. The circuit substrate of claim 29 wherein the coupling surface of the bumps have a roughness in a range between 5 and 15 microns.

33. The circuit substrate of claim 29 wherein the plating means includes a layer of nickel and a layer of gold.

34. The circuit substrate of claim 33 wherein the layer of nickel plating is between about 0.5 and 1 microns in thickness.

35. The circuit substrate of claim 33 wherein the mean total thickness of the gold plating is about 1.5 microns.

36. The circuit substrate of claim 33 wherein the gold layer is about 1 micron in thickness.

37. The circuit substrate of claim 29 wherein the bump is formed of copper.

38. The circuit substrate of claim 37 wherein the rolled copper foil has a surface roughness of about 3 microns.

39. The circuit substrate of claim 38 wherein the plating means increases the overall roughness of the plated bump surface to within a range of 5–20 microns.

40. The circuit substrate of claim 37 wherein the electrolytic copper foil has a surface roughness of about 9 microns.

41. The circuit substrate of claim 40 wherein the plating means increases the overall roughness of the plated bump surface within a range of 5–20 microns.

42. The circuit substrate of claim 29 wherein the gold plating increases the roughness of the coupling surface of the bump by an additional 2–6 microns.

43. The circuit substrate of claim 31 wherein the gold plating increases the roughness of the coupling surface of the bump by an additional 2–6 microns.

44. The circuit substrate of claim 36 wherein the gold plating increases the roughness of the coupling surface of the bump by an additional 2–6 microns.

45. The circuit substrate of claim 29 wherein the gold is plated with an electric current density of 2.5 A/dm for about one minute.

46. The circuit substrate of claim 29 wherein the base means is formed as a thin tape adapted to be coupled to a multiplicity of semiconductor elements.

47. The circuit substrate of claim 44 wherein the substrate includes device openings each of which is adapted to receive a semiconductor element therein.

48. The circuit substrate of claim 44 wherein the substrate includes sprocket holes for controlling movement and alignment of the substrate.

49. A method for forming bumps on the conductive layer mounted on base means formed of insulating material of a circuit substrate for attachment of the circuit substrate to conductive pads of a semiconductor element, comprising:

coating a front and a back surface of the conductive layer with photo-resists;

patterning the photo-resists on both surfaces of the conductive layer by simultaneous exposure and development;

half-etching both surfaces of the conductive layer;

coating one of the surfaces of the conductive layer with a protective resist;

etching the other surface of the conductive layer; and removing the photo-resists and the protective resist; whereby a bump is formed on the first surface.

50. The method of claim 49 further including plating the surface of the bump to increase the roughness of the surface.

51. The method of claim 50 wherein the surface of the bump is plated by plating with nickel and then plating with gold.

52. The method of claim 51 wherein the gold is plated by applying an electric current density of about 2.5 A/dm.

53. The method of claim 52 wherein the electric current density of 2.5 A/dm is applied for about one minute.

54. The method of claim 49 wherein the other surface of the conductive layer is coated with a photo-resist having a thickness of between about 1 and 3 microns and the one surface of the conductive layer is coated with a photo-resist having a thickness between about 1.5 and 4 microns.

55. The method of claim 49 wherein the photo-resists are patterned using to photo-masks.

56. The method of claim 55 wherein one of the masks is compared to pattern circuit connections and the other mask is patterned to form the bumps.

57. The method of claim 56 wherein the photo-mask for forming the bumps form groups of bumps.

58. The method of claim 47 wherein both surfaces of the conductive layer are simultaneously exposed by a 2-sided exposure apparatus.

59. The method of claim 49 wherein both surfaces of the conductive layer are simultaneously developed by spraying with a development solution.

60. The method of claim 49 wherein both surfaces of the conductive layer are simultaneously developed by dipping in a development solution.

61. The method of claim 49 wherein both surfaces of the conductive layer are half-etched by spraying an etching solution.

62. The method of claim 49 wherein both surfaces of the conductive layer are half-etched by spraying with ferric chloride.

63. The method of claim 60 wherein the spray pressure is reduced at the edges to form rounded curves at the corners of the half-etched portion.

64. The method of claim 61 wherein a solution of ferric chloride having a temperature between about 25° and 40° C. with a specific gravity between about 30 and 60 Be at a spraying pressure less than or equal to 0.5 kgf/cm$^2$ is sprayed as the etching solution.

* * * * *